US009157168B2

(12) United States Patent
Sudo et al.

(10) Patent No.: US 9,157,168 B2
(45) Date of Patent: Oct. 13, 2015

(54) VITREOUS SILICA CRUCIBLE HAVING TRANSPARENT LAYER, BUBBLE-CONTAINING LAYER, AND SEMI-TRANSPARENT LAYER IN ITS WALL, METHOD OF MANUFACTURING THE SAME, AND METHOD OF MANUFACTURING SILICON INGOT

(75) Inventors: Toshiaki Sudo, Akita (JP); Hiroshi Kishi, Akita (JP); Eriko Suzuki, Akita (JP)

(73) Assignee: SUMCO CORPORATION, Tokyo (JP)

( * ) Notice: Subject to any disclaimer, the term of this patent is extended or adjusted under 35 U.S.C. 154(b) by 741 days.

(21) Appl. No.: 13/166,189

(22) Filed: Jun. 22, 2011

(65) Prior Publication Data

US 2011/0315072 A1 Dec. 29, 2011

(30) Foreign Application Priority Data

Jun. 25, 2010 (JP) ................................ 2010-145565

(51) Int. Cl.
*C30B 15/10* (2006.01)
*C03B 19/09* (2006.01)
(Continued)

(52) U.S. Cl.
CPC ............... *C30B 15/10* (2013.01); *C03B 19/095* (2013.01); *C30B 29/06* (2013.01); *C30B 35/002* (2013.01); *Y10T 117/1032* (2015.01)

(58) Field of Classification Search
CPC ...... C30B 15/00; C30B 15/10; Y10T 117/00; Y10T 117/10; Y10T 117/1024; Y10T 117/1032; Y10T 117/1092
USPC ............... 117/11, 13, 19, 200, 206, 208, 928, 117/931–932
See application file for complete search history.

(56) References Cited

U.S. PATENT DOCUMENTS 5,989,021 A 11/1999 Sato et al.
2006/0236916 A1* 10/2006 Ohama .......................... 117/13
(Continued)

FOREIGN PATENT DOCUMENTS

EP 2182099 A1 5/2010
JP 2000-247778 A 9/2000
(Continued)

OTHER PUBLICATIONS

Partial European Search Report mailed Oct. 28, 2011, issued in EP counterpart Application No. EP 11171093.5 (5 pages).
(Continued)

*Primary Examiner* — Kenneth A Bratland, Jr.
(74) *Attorney, Agent, or Firm* — Law Office of Katsuhiro Arai

(57) ABSTRACT

Provided is a vitreous silica crucible which can suppress inward sagging and buckling of the sidewall effectively even when time for pulling silicon ingots is extremely long. According to the present invention, provided is a vitreous silica crucible for pulling a silicon single crystal, wherein the crucible has a wall comprising, from an inner surface toward an outer surface of the crucible, a transparent vitreous silica layer having a bubble content rate of less than 0.5%, a bubble-containing vitreous silica layer having a bubble content rate of 1% or more and less than 50%, a semi-transparent vitreous silica layer having a bubble content rate of 0.5% or more and less than 1.0% and having an OH group concentration of 35 ppm or more and less than 300 ppm.

5 Claims, 4 Drawing Sheets

Enlarged View of Region A

A

3

Inner Side of Crucible

Outer Side of Crucible 3a 3b 3c 3d

(51) Int. Cl.
*C30B 29/06* (2006.01)
*C30B 35/00* (2006.01)

(56) References Cited

U.S. PATENT DOCUMENTS

2007/0051296 A1* 3/2007 Kemmochi et al. ............ 117/13
2007/0256628 A1 11/2007 Saito et al.
2009/0165700 A1* 7/2009 Kishi et al. ..................... 117/13
2009/0320521 A1 12/2009 Lehmann et al.
2010/0005836 A1 1/2010 Kishi et al.
2010/0107970 A1 5/2010 Kodama et al.

FOREIGN PATENT DOCUMENTS

JP 2000247778 A * 9/2000
JP 2007-277024 A 10/2007

OTHER PUBLICATIONS

Taiwan Office Action, issued by Taiwan Patent Office, mailed Sep. 26, 2013, for Taiwanese counterpart application No. 100122050.

* cited by examiner

VITREOUS SILICA CRUCIBLE HAVING TRANSPARENT LAYER, BUBBLE-CONTAINING LAYER, AND SEMI-TRANSPARENT LAYER IN ITS WALL, METHOD OF MANUFACTURING THE SAME, AND METHOD OF MANUFACTURING SILICON INGOT

CROSS-REFERENCE TO RELATED APPLICATION

This application is related to Japanese Patent Application No. 2010-145565 filed on Jun. 25, 2010, whose priory is claimed and the disclosure of which is incorporated by reference in its entirety.

BACKGROUND OF THE INVENTION

1. Field of the Invention

The present invention relates to a vitreous silica crucible and a method of manufacturing the same, and a method of manufacturing a silicon ingot.

2. Description of Related Art

In general, a silicon single crystal is manufactured by melting high-purity polycrystalline silicon in a vitreous silica crucible to obtain silicon melt, dipping an end of a seed crystal to the silicon melt, and pulling the seed crystal while rotating it.

The melting point of silicon is 1410 deg. C., and thus the temperature of silicon melt is kept at a temperature higher than 1410 deg. C. At such temperature, a vitreous silica crucible reacts with silicon melt, and the thickness of the crucible wall gradually decreases. When the thickness of the crucible wall decreases, the strength of the crucible is lowered. This leads to problems such as buckling and sidewall lowering of the crucible.

In order to solve such problem, there is known a technique to promote crystallization of inner surface of a crucible by adding barium into silicon melt (See JP-A-2007-277024). Cristobalite, which is crystalline silica, has higher per-thickness strength than vitreous silica and has lower reactivity with silicon melt than vitreous silica. Therefore, crystallization enhances per-thickness strength and suppresses wall thickness reduction of the crucible.

Furthermore, there is known a technique to provide a layer, on the outside of the crucible, to promote crystallization. When such a layer is provided, the outer layer of the crucible is crystallized and the crucible strength is improved (e.g. JP-A-2000-247778).

SUMMARY OF THE INVENTION

Conventionally, a vitreous silica crucible is used to pull a single silicon ingot, and after the single pulling, the vitreous silica crucible is discarded without being reused (such pulling is called “single pulling”). For such use, by use of techniques in the documents above, the crucible strength is improved, and thus if the time for pulling a silicon ingot is approx. 100 hours, problems such as buckling and sidewall lowering of the crucible can be solved to some extent.

However, nowadays, for the purpose of cost reduction of a silicon ingot, a vitreous silica crucible is started to be used for multi-pulling, where after a first silicon ingot is pulled using a vitreous silica crucible, the vitreous silica crucible is re-used for pulling a second silicon ingot by re-charging and melting polycrystalline silicon before the crucible is cooled down. Thus, “multi-pulling” means pulling multiple silicon ingots using a single vitreous silica crucible. In such use, the time for pulling silicon ingots can be as long as 400 hours, and in this case, inward sagging and buckling of the sidewall cannot be completely prevented only by the techniques of the documents above.

The present invention has been made in view of these circumstances, and provides a vitreous silica crucible which can suppress inward sagging and buckling of the sidewall effectively even when time for pulling silicon ingots is extremely long.

According to the present invention, provided is a vitreous silica crucible for pulling a silicon single crystal, wherein the crucible has a wall having, from an inner surface toward an outer surface of the crucible, a transparent vitreous silica layer (hereinafter referred to as “transparent layer”) having a bubble content rate of less than 0.5%, a bubble-containing vitreous silica layer (hereinafter referred to as “bubble-containing layer”) having a bubble content rate of 1% or more and less than 50%, a semi-transparent vitreous silica layer (hereinafter referred to as “semi-transparent layer”) having a bubble content rate of 0.5% or more and less than 1.0% and having an OH group concentration of 35 ppm or more and less than 300 ppm.

The present inventors have found that, when pulling of a silicon ingot by use of a vitreous silica crucible is performed for a long time, the semi-transparent layer expands to a direction vertical to the crucible wall to form a layer, in the crucible wall, with very low density (hereinafter referred to as “low-density layer”). Inward sagging or buckling of the sidewall is a phenomenon which is caused by the inward sagging of the upper portion of the crucible sidewall when the amount of silicon melt in the crucible is small. The formation of the low-density layer reduces density in the upper portion of the crucible, and thus inward force of the upper portion of the crucible is weakened, and thus inward sagging and buckling of the sidewall are suppressed.

The principle that the low-density layer is formed is not necessarily clear, but it is presumed in the following way. When a crucible is heated during pulling of a silicon ingot, OH groups in the semi-transparent layer is separated to become vapor. When the vapor is trapped in bubbles existing in the semi-transparent layer, the vapor expands the bubbles. The semi-transparent layer has low bubble content rate, and thus the amount of vapor trapped in each of the bubble is large, and thus the bubbles largely expands to form a low-density layer. The bubble-containing layer having a bubble content rate of 1% or more has too many bubbles and thus the amount of vapor trapped in each of the bubbles is small and thus expansion of bubbles is limited, and the low-density layer is not formed.

It is necessary to provide a bubble layer between the transparent layer and the semi-transparent layer. In the absence of this bubble layer, vapor generated in the semi-transparent layer can move to the transparent layer and expand bubbles in the transparent layer. Expansion of bubbles in the transparent layer is not preferable because the expansion can cause rupture of the bubbles which generates small vitreous silica pieces, which eventually mix in silicon melt.

As mentioned above, by use of the crucible of the present invention, a low-density layer is formed after long-time pulling of a silicon ingot, and thus inward sagging and buckling of the sidewall can be effectively suppressed.

DESCRIPTION OF THE PREFERRED EMBODIMENTS

1. Configuration of Vitreous Silica Crucible

Figure 1:
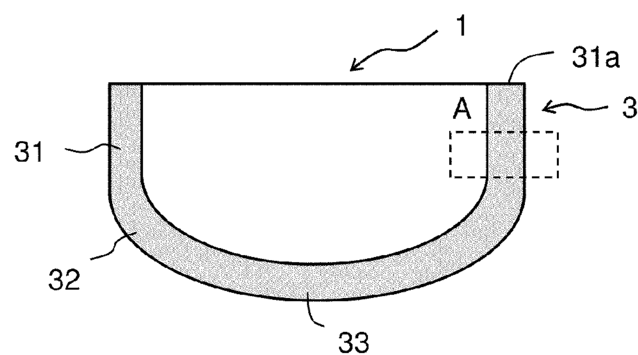
FIG. 1 a sectional view showing structure of a vitreous silica crucible, according to an embodiment of the present invention.
Figure 2:
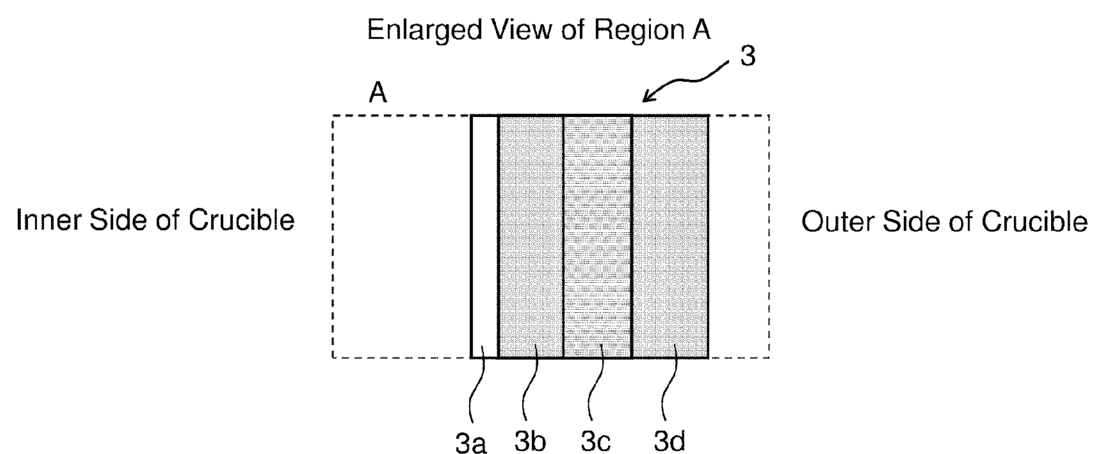
FIG. 2 is an enlarged view of the region A in FIG. 1.
Figure 3:
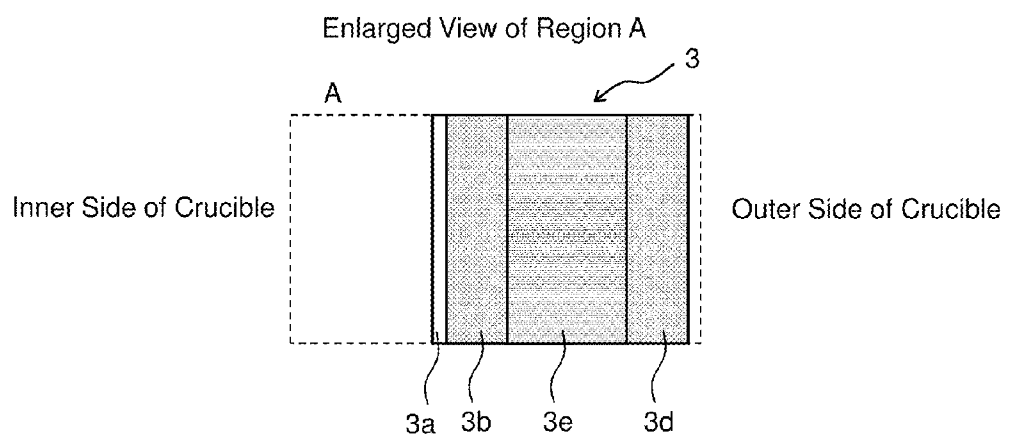
FIG. 3 is an enlarged view of the region A in FIG. 1 which shows structure of the vitreous silica crucible, after long-time use, of the present invention.

Hereinafter, with reference to FIGS. 1 to 3, embodiments of a vitreous silica crucible of the present invention will be explained. FIG. 1 is a sectional view showing a structure of a vitreous silica crucible of the present embodiment, and FIG. 2 is an enlarged view of the region A in the FIG. 1. FIG. 3 is an enlarged view of the region A in FIG. 1 which shows structure of the vitreous silica crucible, after long-time use, of the present invention.

As shown in FIGS. 1 to 3, the vitreous silica crucible 1 of the present embodiment is a vitreous silica crucible 1 for pulling a silicon single crystal, and has a wall 3 having, from the inner surface toward the outer surface of the crucible 1, a transparent layer **3*a* having a bubble content rate of less than 0.5%, a bubble-containing layer 3*b* having a bubble content rate of 1% or more and less than 50%, a semi-transparent layer 3*c* having a bubble content rate of 0.5% or more and less than 1.0% and having an OH group concentration of 35 ppm or more and less than 300 ppm. In addition, as shown in FIG. 3, bubbles in the semi-transparent layer 3*c* expands to the direction vertical to the wall surface to form a low-density layer 3*e***.

Here, the respective components are explained in detail.

(1) Vitreous Silica Crucible 1

The vitreous silica crucible 1 of the present embodiment is used for pulling a silicon single crystal, and can be used for either single pulling and multi-pulling, but it is preferred to be used for multi-pulling. This is because the vitreous silica crucible 1 of the present embodiment solves problems, such as inward sagging and buckling of the sidewall, which are eminent when the pulling time is extremely long, as mentioned above.

(2) Wall 3 of Vitreous Silica Crucible

As shown in the sectional view of FIG. 1, the wall 3 of vitreous silica crucible 1 has a corner portion 32, a cylindrical sidewall portion 31, and a bottom portion 33. The corner portion 32 has a relatively large curvature. The sidewall portion 31 has a rim portion having an upward opening. The bottom portion 33 is flat or has a relatively small curvature, and is mortar-shaped. In the present invention, the corner portion refers to a portion connecting the sidewall portion 31 and the bottom portion 33, and starts at a point where a line tangential to the corner portion 32 overlaps with the sidewall portion 31 and ends at a point where the corner portion 32 and the bottom portion 33 have a common tangential line. In other words, the boundary between the sidewall portion 31 and the corner portion 32 is a point where a straight portion of the wall 3 starts to curve. Furthermore, the portion with a constant curvature at the bottom of the crucible is the bottom portion 33, and as the distance from the center of the crucible increases, a point where the curvature starts to change is the boundary between the bottom portion 33 and the corner portion 32.

The wall 3 has, from the inner surface toward the outer surface, a transparent layer **3*a* having a bubble content rate of less than 0.5%, a bubble-containing layer 3*b* having a bubble content rate of 1% or more and less than 50%, a semi-transparent layer 3*c* having a bubble content rate of 0.5% or more and less than 1.0%. In addition, on the outer side of the semi-transparent layer 3*c*, there may be provided a bubble-containing layer 3*d*** having a bubble content rate of 1% or more and less than 10%.

(2-1) Transparent Layer **3*a***

The transparent layer **3*a* is a layer having a bubble content rate of less than 0.5%, is an innermost layer of the crucible 1, and contacts silicon melt. In the present invention, the bubble content rate refers to the rate ($w_2/w_1$) of the volume ($w_2$) occupied by bubbles in a unit volume ($w_1$) of the crucible 1. When the transparent layer 3*a* contains a large amount of bubbles, the bubbles can rupture during pulling of a silicon ingot. The rupture may generate small pieces of crucible 1, and the pieces can be mixed in the silicon melt, which is problematic. In this view, a smaller bubble content rate is more preferable, and the bubble content rate is preferably less than 0.5%, more preferably less than 0.3%, still more preferably less than 0.1%, and still more preferably less than 0.05%. The bubble content rate can be adjusted by changing the conditions (such as temperature and duration) of arc heating and conditions of pressure reduction. In one example, the transparent layer 3*a*** is formed by fusing, for 1 to 60 minutes, silica powder under a pressure of −50 kPa or more and less than −95 kPa, and at a temperature of 1600 deg. C. to 2600 deg. C.

OH groups contained in vitreous silica structure are released from the vitreous silica as moisture when the vitreous silica is heated ($2Si—OH \rightarrow Si—O—Si+H_2O$). The inner surface of the crucible is heated to the highest temperature because the inner surface is closest to the heat source (arc electrodes). Therefore, the OH group concentration in the crucible increases as the distance from the inner surface increases. Under such concentration gradient, the OH groups contained in the transparent layer **3*a*** move to the inner surface and are released, as moisture, from the inner surface of the crucible. However, OH groups around bubbles flows into the bubbles as moisture. As the amount of the moisture flowing into the bubbles increases, the gas pressure in the bubbles increases, and thus the expansion of the bubbles increases.

When the bubbles in the transparent layer, which is in contact with silicon melt, expands to a large extent, the bubbles may rupture during pulling of a silicon ingot, and small pieces generated by the rupture may mix in the silicon melt, which is problematic. Therefore, a smaller number density of OH groups in the transparent layer is more preferable, and is preferably less than 40 ppm, and more preferably 30 ppm or less. The OH group concentration can be measured by infrared absorption spectroscopy (FT-IR). The OH group concentration can be adjusted by changing temperature and duration of arc heating during manufacturing the vitreous silica crucible 1.

The thickness of the transparent layer **3*a* is not in particular limited, but is preferably 5% or more, and more preferably 10% or more of the thickness of the wall 3. When the transparent layer 3*a* is such thickness, the bubble-containing layer 3*b* is unlikely to be exposed even when the thickness of the transparent layer 3*a* is reduced by the reaction between the silicon melt and the transparent layer 3*a* during pulling of a silicon single crystal. In addition, the thickness of the transparent layer 3***a* is preferably 25% or less and more preferably 20% or less of the thickness of the wall 3. When the transparent layer 3*a* is such thickness, the thickness of the bubble-containing layer 3*b* can be sufficiently thick, and thus the function of the bubble-containing layer 3*b* (to be mentioned below) can be sufficiently achieved.

The transparent layer 3*a* may be formed of either synthetic vitreous silica or natural vitreous silica, but the portion, of the transparent layer, contacting silicon melt is preferably formed of synthetic vitreous silica. Synthetic vitreous silica is vitreous silica obtained by fusing and solidifying chemically synthesized amorphous or crystalline silica (silicon oxide) powder. Natural vitreous silica is vitreous silica obtained by fusing and solidifying silica powder obtained from natural mineral whose main component is α-quartz. Synthetic vitreous silica has very low impurity concentration, and thus mixing of impurities into silicon melt can be reduced by providing synthetic vitreous silica on the portion contacting silicon melt. The method of chemical synthesis of silica is not in particular limited, and may be gas phase oxidation (dry synthesis) of silicon tetrachloride ($SiCl_4$), or hydrolysis (sol-gel method) of silicon alkoxide ($Si(OR)_4$).

(2-2) Bubble-Containing Layer 3*b*

The bubble-containing layer 3*b* has a bubble content rate of 1.0% or more and less than 50% and is provided on the outer side of the transparent layer 3*a*. The bubbles of the bubble-containing layer 3*b* have the following functions. (1) The bubbles capture, as moisture, OH groups moving from the outer side to the inner side of the crucible, and as a result, the amount of OH groups flows into the transparent layer decreases, and consequently the expansion of bubbles in the transparent layer is suppressed, (2) the weight of the crucible is reduced, and (3) the bubbles disperse infrared light from a heater disposed on the peripheral of the crucible 1 during pulling a silicon ingot. The bubble content rate is preferably 20% or less, more preferably 10% or less. When the bubble content rate is too large, the strength of the crucible is lowered.

The formation of the bubble-containing layer 3*b* can be adjusted by changing conditions of pressure reduction in arc heating during manufacturing of a vitreous silica crucible 1. Specifically, the bubble-containing layer 3*b* can be formed by fusing, for 1 to 30 minutes, silica powder under a pressure of 0 kPa or more and less than −10 kPa, and at a temperature of 1600 deg. C. to 2600 deg. C.

(2-3) Semi-Transparent Layer 3*c*

The semi-transparent layer 3*c* is provided on the outer side of the bubble-containing layer 3*b*. The semi-transparent layer 3*c* is a layer having a bubble content rate of 0.5% or more and less than 1.0%. When OH groups in this layer is released, by heating, to produce vapor, and the vapor expands bubbles to form a low-density layer. When the bubble content rate is too low, the vapor is not easily trapped, and thus the low-density layer is not formed. When the bubble content rate is too high, the amount of bubbles trapped by each bubble is too little to form the low-density layer. Thus, the above range of bubble content rate is required to form the low-density layer. In addition, OH group concentration of the semi-transparent layer 3*c* is 35 ppm or more and less than 300 ppm. When the concentration is less than 35 ppm, the amount of released vapor is too little to form the low-density layer, and when the concentration is too large, the vitreous silica is crystallized and thus the low-density layer is not formed.

The thickness of the semi-transparent layer 3*c* is preferably 10% to 60% of the thickness of the wall 3. When the semi-transparent layer 3*c* is too thin, the thickness of the low-density layer formed after the long-time pulling is too thin, and thus the effect of decreasing density of wall 3 is limited. When the semi-transparent layer 3*c* is too thick, the low-density layer is too thick, and the strength of the crucible is lowered. For example, when the wall thickness of the crucible is 20 mm, the thickness of the semi-transparent layer 3*c* is 2 to 12 mm. The bubble content rate can be measured by the Archimedes method. The bubble content rate can be adjusted by changing the conditions (such as temperature and duration) of arc heating and conditions of pressure reduction. Specifically, the semi-transparent layer 3*c* can be formed by fusing, for 5 to 30 minutes, silica powder under a pressure of −10 kPa or more and less than −50 kPa, and at a temperature of 1600 deg. C. to 2600 deg. C.

(2-4) Bubble-Containing Layer 3*d*

The bubble-containing layer 3*d* may be provided on an outer side of the semi-transparent layer 3*c*. Bubbles in the semi-transparent layer 3*c* expand after long-time pulling, and thus numerous minute concavities and convexities are formed on the surface of the semi-transparent layer 3*c*. When the surface is exposed to the outer surface of the crucible, the concavities and convexities are cracked to generate small pieces of vitreous silica. These pieces of vitreous silica can mix in silicon melt. So, so as not to expose the semi-transparent layer 3*c*, it is preferred to provide the bubble-containing layer 3*d* on the outer side of the semi-transparent layer 3*c*.

The total thickness of the bubble-containing layers 3*b* and 3*d* is not in particular limited, but the thickness is preferably 10% or more, and more preferably 20% or more of the thickness of the wall 3. When such thickness is employed, the bubble-containing layer can be sufficiently thick, and thus the bubble-containing layer can exert the above-mentioned functions sufficiently. The total thickness of the bubble-containing layers 3*b* and 3*d* is preferably 50% or less, and more preferably 40% or less of the thickness of the wall 3. When such thickness is employed, the thickness of the transparent layer 3*a* can be sufficiently thick, and thus the bubble-containing layer 3*b* is unlikely to be exposed even when the thickness of the transparent layer 3*a* is reduced by the reaction of silicon melt and the transparent layer 3*a*.

The bubble-containing layers 3*b* and 3*d* may be formed of synthetic vitreous silica or natural vitreous silica, but it is preferred that these layers 3*b* and 3*d* are formed of natural vitreous silica so as to obtain a crucible with high strength.

(2-5) Impurity-Containing Layer

It is preferred that one or both of the bubble-containing layers 3*b* and 3*d* contain an impurity-containing vitreous silica layer (hereinafter referred to as "impurity-containing layer"). The impurity-containing layer is a vitreous silica layer containing impurities. The temperature of silicon melt during pulling of a silicon ingot is about 1450 deg. C. Under such high temperature environment, when impurities are contained in a vitreous silica layer, the impurities act as nucleus, and the vitreous silica can be relatively easily turned into crystalline silica. Because crystalline silica has higher strength than vitreous silica, the crucible 1 is strengthened by this crystallization.

The kind of vitreous silica constituting the impurity-containing layer is not in particular limited, and may be either synthetic vitreous silica or natural vitreous silica.

The kind of the impurities is not limited as long as the impurities promote crystallization of the impurity-containing layer. Metal impurities are preferred because crystallization is particularly promoted when metal impurities are contained. Examples of the metal impurities are alkali metal (such as sodium or potassium), alkali earth metal (such as magnesium or calcium), aluminium. When aluminium is added, viscosity of the impurity-containing layer is increased, and thus it is preferred that the kind of impurities is aluminium. The amount of impurities is not limited as long as the amount is sufficient to promote the crystallization, and thus the amount is, for example, 20 ppm or more. Furthermore, when the amount is too much, the impurities can reach the inner surface of the crucible by heat diffusion, and thus it is preferred that the amount is 500 ppm or less.

The thickness of the impurity-containing layer provided on the bubble-containing layers 3*b* and/or 3*d* is not in particular limited as long as the thickness is the same as or smaller than the thicknesses of the bubble-containing layer 3*b* or 3*d*. The thickness of the impurity-containing layer is preferably 50 to 90%, and more preferably 60-80% of the bubble-containing layer 3*b* or 3*d*. When such range is employed, the strength of the crucible 1 can be enhanced. The thickness can be controlled by controlling the thicknesses of respective materials when those materials are supplied into the rotating mold.

The boundary between the impurity-containing layer and the neighboring natural layer can be determined by determining the maximum value of the concentration of impurities, and connecting points each having a concentration of one tenth of the maximum value. The concentration can be measured by using Secondary Ion Mass Spectrometry (SIMS) which can determine distribution and quantity of respective elements by irradiating a sample with ions, and analyzing, by mass spectrometry, secondary ions released from the surface of the sample by sputtering.

Specifically, a sample having a square of 10 mm×10 mm and a thickness of 3 mm is cut out from the crucible, and the sample is set on a sample holder in a way that a surface, of the sample, vertical to the inner surface of the crucible is irradiated with primary ions. Then, the sample is irradiated with the primary ions of oxygen ($O^{2+}$) or cesium ($Cs^{+}$) under vacuum atmosphere. Then, secondary ions released by the irradiation of the primary ions are analyzed by mass spectrometry to identify elements constituting the sample. Then, the concentrations of the respective elements of the sample can be quantitatively analyzed by the ratio of the strength of the secondary ions of the sample and the strength of the secondary ions released from a standard sample (concentrations of constituent elements of the sample are known).

2. Method of Manufacturing Vitreous Silica Crucible

The vitreous silica crucible 1 of the present embodiment can be manufactured by the processes of (1) forming a silica powder layer for a natural vitreous silica layer (hereinafter referred to as "natural layer"), a synthetic vitreous silica layer (hereinafter referred to as "synthetic layer"), and an impurity-containing layer in this order by depositing crystalline or amorphous silica powder on the inner surface (on the bottom surface and the side surface) of a rotating mold, and (2) fusing the silica powder layer and solidifying it. The fusing is performed by heating the silica powder layer for 4 to 120 minutes while depressurizing the silica powder layer from the mold side at a pressure of 0 kPa to −95 kPa and at a temperature of 1600 to 2600 deg. C.

The silica powder to form the natural layer (natural silica powder) can be manufactured by pulverizing natural mineral whose main component is α-quartz.

The silica powder to form the synthetic layer (synthetic silica powder) can be manufactured by chemical synthesis, such as gas phase oxidation (dry synthesis) of silicon tetrachloride ($SiCl_4$), or hydrolysis (sol-gel method) of silicon alkoxide ($Si(OR)_4$).

The silica powder to form the impurity-containing layer can be obtained by mixing the natural or synthetic silica powder with impurities. In one example, impurities can be introduced into the silica powder by mixing the silica powder with metal alkoxide, followed by heat treatment at 600 to 1100 deg. C., to attach the impurities (in this case, metal impurities) to the surface of the silica powder.

The vitreous silica crucible 1 having the above configuration can be manufactured by fusing and solidifying a silica powder layer according to the above-mentioned conditions. The bubble content rate, the number of bubbles, and the number density of OH group are influenced by the pressure during pressure reduction, heating temperature and duration. Therefore, it is possible to manufacture a vitreous silica crucible having a desired bubble content rate, number of bubbles, and number density of OH group by changing the pressure during pressure reduction, heating temperature and duration.

The bubble content rate of each of the vitreous silica layers can be adjusted by changing the pressure during pressure reduction when fusing the silica powder layer. The silica powder layer is fused by arc discharge between electrodes disposed inside of the crucible, and thus the silica powder layer is fused from the inside of the crucible. Therefore, first, the silica powder layer is fused in a predetermined thickness under a reduced pressure of −50 kPa or more and less than −95 kPa to form the transparent layer 3*a*, then the silica powder layer is fused in a predetermined thickness under a reduced pressure of 0 kPa or more and less than −10 kPa to form the bubble-containing layer 3*b*, then the silica powder layer is fused in a predetermined thickness under a reduced pressure of −10 kPa or more and less than −50 kPa to form the semi-transparent layer 3*c*, and then, when necessary, the silica powder layer is fused in a predetermined thickness under a reduced pressure of 0 kPa or more and less than −10 kPa to form the bubble-containing layer 3*d*.

3. Method of Manufacturing Silicon Ingot

A silicon ingot can be manufactured by the processes of (1) forming silicon melt by melting polycrystalline silicon in the vitreous silica crucible 1 of the present embodiment, and (2) dipping an end of a silicon seed crystal to the silicon melt, and pulling the seed crystal while rotating the seed crystal.

In order to pull a silicon single crystal multiple times, polycrystalline silicon is recharged and melted in the vitreous silica crucible 1, and a silicon ingot is pulled again. When a conventional crucible is used for the multi-pulling, in the recharging and melting process, the wall thickness of the crucible 1 is reduced and thus the strength is lowered. As a result, inward sagging or buckling of the sidewall occasionally occurred. However, when the vitreous silica crucible 1 of the present embodiment is used for multi-pulling, the low-density layer 3*c* develops and as a result, the density of the crucible decreases and thus inward sagging and buckling of the sidewall is prevented.

It is preferred to add Ba in the silicon melt. Ba promotes crystallization of the inner surface of the crucible. The amount of Ba added in the silicon melt is not in particular limited, but is preferably 0.05 to 5 ppm. When the amount is in such range, it is possible to crystallize the inner surface of the crucible 1, and the influence of Ba mixed in the silicon ingot can be ignored.

EXAMPLE

Figure 4:
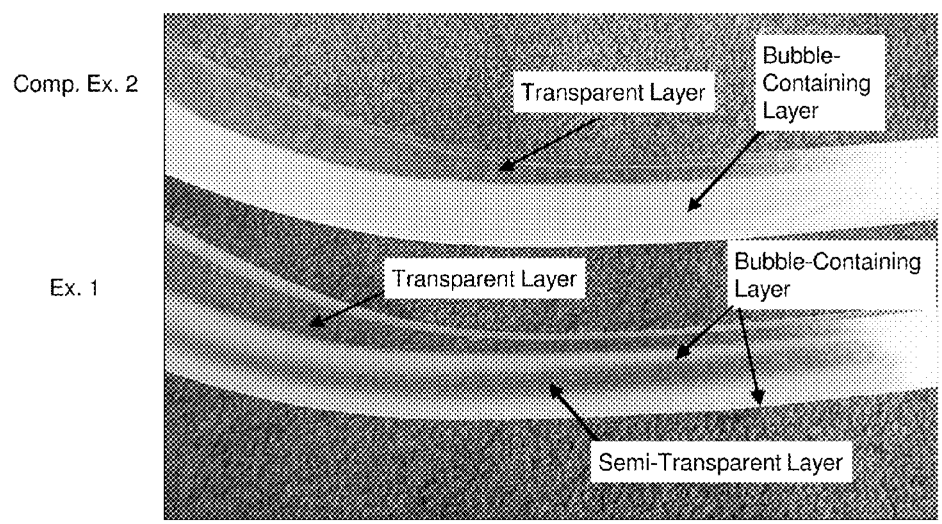
FIG. 4 is a photograph showing crucibles, before use, of Example 1 and Comparative Example 2.

1. Influence of Bubble Content Rate and OH Group of Semi-Transparent Layer 3*c* on Formation of Low-Density Layer Crucibles each having an outer diameter of 800 mm were manufactured. Crucibles in Examples and Comparative Examples were manufactured by depositing, on the inner surface of the rotating mold, natural silica powder in a thickness of 36 mm, and synthetic silica powder thereon in a thickness of 4 mm, and heating and fusing the obtained silica powder layer by arc discharge, followed by solidifying. During arc discharge, the silica powder layer was subjected to a reduced pressure from the mold side. The reduced pressure and heating conditions were as shown in Table 1. According to the conditions in Table 1, the transparent layer, the bubble-containing layer, the semi-transparent layer, and the bubble-containing layer were formed in this order from the inner side of the crucible. However, in Comparative Example 2, a bubble-containing layer was formed on the position of the semi-transparent layer (i.e. the crucible has two layer structure of a transparent layer and a bubble-containing layer). In Comparative Example 3, a transparent layer was formed on the position of the semi-transparent layer. Photographs of the cross section of the crucibles of Example 1 and Comparative Example 2 are shown in FIG. 4. As shown in FIG. 4, the crucible wall of Example 1 has four-layer structure,

TABLE 1

| | Pressure (kPa) | | | In Forming Semi-Transparent Layer | |
|---|---|---|---|---|---|
| | In Forming Transparent Layer | In Forming Bubble-Containing Layer | In Forming Semi-Transparent Layer | Heating Temperature deg. C. | Heating Time (min.) |
| Ex. 1 | −80 | −5 | −12 | 2000 | 15 |
| Ex. 2 | −80 | −5 | −48 | 2000 | 15 |
| Ex. 3 | −80 | −5 | −12 | 2000 | 6 |
| Ex. 4 | −80 | −5 | −12 | 2000 | 28 |
| Ex. 5 | −80 | −5 | −12 | 1700 | 15 |
| Ex. 6 | −80 | −5 | −12 | 2500 | 15 |
| Ex. 7 | −80 | −5 | −12 | 2000 | 3 |
| Ex. 8 | −80 | −5 | −12 | 2000 | 35 |
| Ex. 9 | −80 | −5 | −12 | 1500 | 30 |
| Comp. Ex. 1 | −80 | −5 | −12 | 2700 | 5 |
| Comp. Ex. 2 | −80 | −5 | −5 | 2000 | 15 |
| Comp. Ex. 3 | −80 | −5 | −60 | 2000 | 15 |

Next, as to crucibles manufactured according to conditions shown in Table 1, the bubble content rate of the semi-transparent layer, the thickness of the semi-transparent layer, the OH group concentration of the semi-transparent layer were measured. Furthermore, the bubble content rates of the transparent layer and the bubble-containing layer were measured, and they were 0.04% and 1.5%, respectively. The thicknesses of the transparent layer and the outer bubble-containing layer were 10% of the wall thickness, respectively, and the thickness of the inner bubble-containing layer was the thickness obtained by subtracting the thickness of the semi-transparent layer from the remaining 80%.

Figure 5:
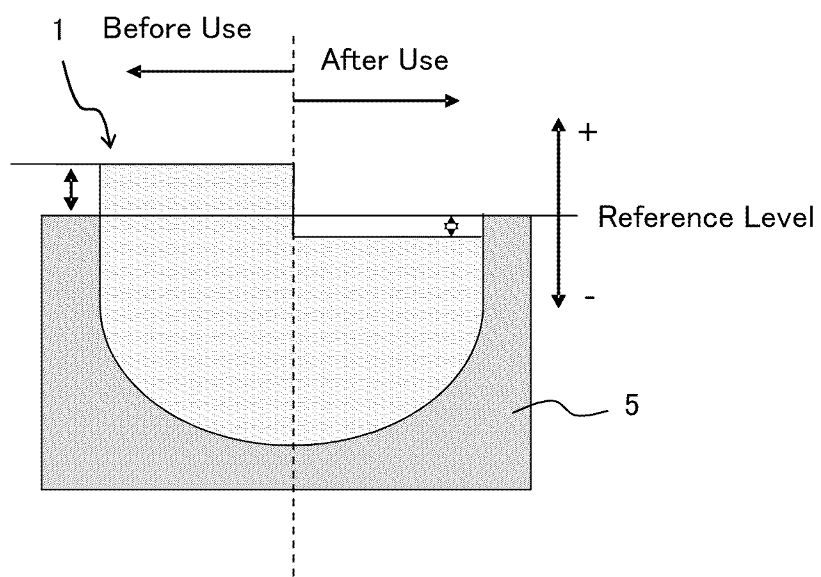
FIG. 5 is a sectional view for explaining evaluation criteria of a crucible in Examples.

Then, the crucibles were evaluated, as to formation of the low-density layer and the strength, in actual pulling of silicon single crystals. Strength was evaluated based on the amount of sidewall lowering obtained by measuring, before and after use (after 400-hour pulling), the distance from the reference level (which is the upper end of the carbon susceptor 5) to the upper end of the crucible 1 (See FIG. 5). The results are shown in Table 2. The evaluation criteria are shown below.

Evaluation Criteria

A: the amount of sidewall lowering is less than 10 mm

B: the amount of sidewall lowering is 10 mm or more and less than 20 mm

C: the amount of sidewall lowering is 20 mm or more and less than 30 mm

TABLE 2

| | Semi-Transparent Layer | | | | |
|---|---|---|---|---|---|
| | Bubble Content Rate (%) | OH Group (ppm) | Thickness of Semi-Transparent Layer to Thickness of Wall (%) | Low-Density Layer | Amount of Sidewall Lowering |
| Ex. 1 | 0.9 | 50 | 30 | Formed | B |
| Ex. 2 | 0.52 | 50 | 30 | Formed | B |
| Ex. 3 | 0.9 | 60 | 12 | Formed | B |
| Ex. 4 | 0.9 | 45 | 57 | Formed | B |
| Ex. 5 | 0.9 | 60 | 15 | Formed | B |
| Ex. 6 | 0.9 | 45 | 50 | Formed | B |
| Ex. 7 | 0.9 | 57 | 7 | Formed | C |
| Ex. 8 | 0.9 | 42 | 65 | Formed | C |
| Ex. 9 | 0.9 | 60 | 8 | Formed | C |
| Comp. Ex. 1 | 0.9 | 30 | 30 | Not Formed | D |
| Comp. Ex. 2 | 1.5 | — | 0 | Not Formed | D |
| Comp. Ex. 3 | 0.3 | — | 0 | Not Formed | D |

Figure 6:
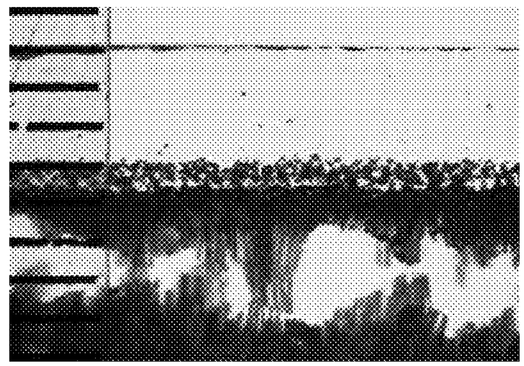
FIG. 6 is a photograph of the cross section of the crucible, after long-time use, of Example 1
Figure 7:
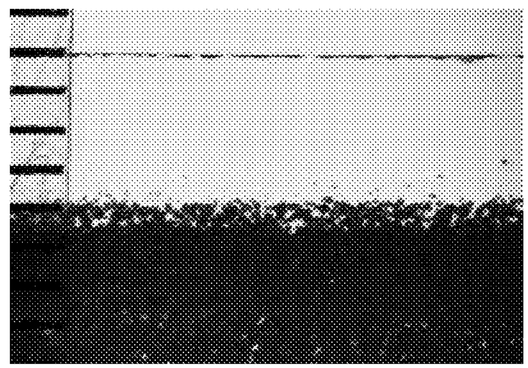
FIG. 7 is a photograph of the cross section of the crucible, after long-time use, of Comparative Example 2

In the crucibles of Examples 1 to 9, the bubbles in the semi-transparent layer expanded to a large extent as shown in FIG. 6 (photograph of the cross section of the crucible of Example 1), and a low-density layer was formed. In contrast, in Comparative Examples 1 to 3, a low-density layer was not formed as shown in FIG. 7 (photograph of the cross section of the crucible of Comparative Example 2).

As shown in Table 2, in Examples 1 to 9, the bubble content rate of the semi-transparent layer was 0.5 or more and less than 1.0 and the OH group concentration was 35 ppm or more, the low-density layer was formed, and thus the crucible strength was high. Furthermore, in Examples 1 to 6, the thickness of the semi-transparent layer to the wall thickness was 10 to 60%, and thus the crucible strength was particularly high. In contrast, in Comparative Example 1, the OH group concentration was too low and thus the low-density layer was not formed, and in Comparative Examples 2 to 3, the bubble content rate was too low or too high, and thus the low-density layer was not formed, and thus the crucible strength was low.

2. Influence of Al Layer on Outer Surface Side

Influence of Al layers introduced on the bubble layers (3*b* and 3*d*) was investigated. In Example 10, a silica powder layer was formed by depositing, on the inner surface of the rotating mold, Al-containing natural silica powder in a thickness of 12 mm, natural silica powder in a thickness of 20 mm, Al-containing natural silica powder in a thickness of 4 mm, and synthetic silica powder in a thickness of 4 mm in this order, and the obtained silica powder layer was heated and fused by arc discharge and solidified to form a crucible. Al-containing natural silica powder was prepared so as to have Al concentration which is 20 ppm higher than that of natural silica powder. During arc discharge, the silica powder layer was depressurized from the mold side. The pressure of the reduced pressure, heating temperature and time was set to the same value as Example 1.

Using the crucibles of Examples 1 and 10, under the same conditions with Example 1, multi-pulling of silicon ingots was performed, and the amount of sidewall lowering was measured. The evaluation criteria are the same as those mentioned above.

The results are shown in Table 3.

TABLE 3

| | Amount of Sidewall Lowering |
|---|---|
| Ex. 1 | B |
| Ex. 10 (Ex. 1 + Al layer) | A |

As shown in Table 3, compared with the crucible of Example 1, the amount of sidewall lowering was reduced in Example 10 where Al layer was introduced into the crucible of Example 1. This shows that the amount of sidewall lowering can be reduced by providing an impurity-containing layer.

3. Influence of Ba Addition to Silicon Melt

A crucible was manufactured under the same conditions as those of Example 1, and multi-pulling of silicon ingots was performed under the same conditions except that 1 ppm of Ba was added to silicon melt, and the amount of sidewall lowering was investigated.

The amount of sidewall lowering was "A" in the evaluation criteria shown above when Ba was added to the silicon melt in the crucible above. This shows that the amount of sidewall lowering can be reduced by adding Ba to silicon melt.

What is claimed is:

1. A vitreous silica crucible for pulling a silicon single crystal, wherein the crucible has a wall comprising, from an inner surface toward an outer surface of the crucible, a transparent vitreous silica layer having a bubble content rate of less than 0.5% and having an OH group concentration of 30 ppm or less, a first bubble-containing vitreous silica layer having a bubble content rate of 1% or more and less than 50%, a semi-transparent vitreous silica layer having a bubble content rate of 0.5% or more and less than 1.0% and having an OH group concentration of 35 ppm or more and less than 300 ppm, and a second bubble-containing vitreous silica layer having a bubble content rate of 1% or more and less than 50%;

wherein the first bubble-containing vitreous silica layer comprises an impurity-containing vitreous silica layer to which impurities are added acting as nuclei when turning the vitreous silica into crystalline silica in a high temperature environment, wherein a concentration of impurities in the impurity-containing vitreous silica layer is 20 ppm or higher and is higher than that in the neighboring layers, and wherein the total thickness of the first and second bubble-containing vitreous silica layers is 50% or less of the thickness of the wall.

2. The crucible of claim 1, wherein the thickness of the semi-transparent vitreous silica layer is 10% to 60% of the thickness of the wall of the crucible.

3. The crucible of claim 1, wherein the second bubble-containing vitreous silica layer on the outer side of the semi-transparent vitreous silica layer comprises an impurity-containing vitreous silica layer to which are added acting as nuclei when turning the vitreous silica into crystalline silica in a high temperature environment.

4. The crucible of claim 1, wherein the impurity-containing vitreous silica layer contains the impurities in an amount of 20 ppm to 500 ppm.

5. The crucible of claim 1, wherein the impurity-containing vitreous silica layer has a thickness which is 50% to 90% of a thickness of the bubble-containing vitreous silica layer.

* * * * *